United States Patent [19]

Torimaru et al.

[11] Patent Number: 5,077,495

[45] Date of Patent: Dec. 31, 1991

[54] ROW DECODER FOR A SEMICONDUCTOR MEMORY DEVICE WITH FAST TURN-OFF

[75] Inventors: Yasuo Torimaru, Nara; Katsumi Sawai, Tenri, both of Japan

[73] Assignee: Sharp Kabushiki Kaisha, Japan

[21] Appl. No.: 481,307

[22] Filed: Feb. 16, 1990

[30] Foreign Application Priority Data

Feb. 17, 1989 [JP] Japan .................................. 1-38746

[51] Int. Cl.⁵ .................... H03K 19/094; H03K 19/20
[52] U.S. Cl. .................................. 307/449; 307/443; 307/445; 307/451
[58] Field of Search ............... 307/443, 445, 447, 449, 307/451, 576, 585

[56] References Cited

U.S. PATENT DOCUMENTS

| | | | |
|---|---|---|---|
| 3,691,534 | 11/1970 | Varadi et al. | 307/449 |
| 4,024,676 | 3/1977 | Yamamura | 307/451 |
| 4,063,118 | 12/1977 | Nishimura | 307/481 |
| 4,162,540 | 7/1979 | Ando | 307/350 |
| 4,170,741 | 10/1979 | Williams | 307/279 |
| 4,301,535 | 11/1981 | McKenny et al. | 307/449 |
| 4,649,296 | 3/1987 | Shoji | 307/451 |
| 4,692,639 | 9/1987 | Jordan | 307/481 |
| 4,788,457 | 11/1988 | Mashiko et al. | 307/451 |
| 4,797,579 | 1/1989 | Lewis | 307/451 |
| 4,827,159 | 5/1989 | Naganuma | 307/451 |
| 4,890,016 | 12/1989 | Tanaka et al. | 307/443 |
| 5,019,725 | 5/1991 | Yoshino | 307/594 |

FOREIGN PATENT DOCUMENTS 2119193 11/1983 United Kingdom .................. 307/451

Primary Examiner—Stanley D. Miller
Assistant Examiner—Terry D. Cunmnngham
Attorney, Agent, or Firm—Nixon & Vanderhye

[57] ABSTRACT

A row decoder for a semiconductor memory device is disclosed. The row decoder comprises: CMOS NAND circuits each having P-channel transistors and N-channel transistors; and CMOS NOR circuits which follow the NAND circuits and have P-channel transistors and one or more N-channel transistors. The ratio of the channel length to the channel width of the P-channel transistors of the NAND circuits is greater than that of the N-channel transistors of the NAND circuits. And, the ratio of the channel length to the channel width of the N-channel transistors of the NOR circuits is greater than that of the P-channel transistors of the NOR circuits.

1 Claim, 3 Drawing Sheets

ROW DECODER

ROW DECODER

ROW DECODER FOR A SEMICONDUCTOR MEMORY DEVICE WITH FAST TURN-OFF

BACKGROUND OF THE INVENTION

1. Field of the Invention

This invention relates to a row decoder for a semiconductor memory device.

2. Description of the Prior Art

FIG. 1 illustrates a row decoder used in a semiconductor memory device. The row decoder of FIG. 1 includes a predecoder 1 comprising CMOS (Complementary Metal-Oxide Semiconductor) type NAND circuits 4, and a main decoder 2 comprising CMOS type NOR circuits 5. The output of each of the NAND circuit 4 is connected to a plurality of the NOR circuits 5. The outputs of the NOR circuits 5 are connected to a memory cell array 3 through word lines (W.L.) 6. The outputs of NOR circuits 5 connected to the two NAND circuits 4 shown in FIG. 1 are respectively referenced by a to h. As shown in FIG. 2, each of the NAND circuits 4 has P-channel transistors 21, 22, 23, . . . connected in parallel, and N-channel transistors 31, 32, 33, . . . connected in series. From the standpoints of a balance of the rising and falling rates of the output and also of a margin for noise, the (channel width)/(channel length) ratio (hereinafter abbreviated as W/L ratio) of the N-channel transistors 31, 32, 33, . . . is greater than the W/L ratio of the P-channel transistors 21, 22, 23, . . . From similar standpoints, in each of the NOR circuits 5 which, as shown in FIG. 3, has P-channel transistors 41, 42, 43, . . . connected in series and N-channel transistors 51, 52, 53, . . . in parallel, the W/L ratio of the P-channel transistors 41, 42, 43, . . . is greater than the W/L ratio of the N-channel transistors 51, 52, 53, . . .

As mentioned above, in the NAND circuit 4 shown in FIG. 2, the W/L ratio of the N-channel transistors 31, 32, 33, . . . is greater than the W/L ratio of the P-channel transistors 21, 22, 23, . . . When, for example, an input signal 11 is LOW and other input signals 12, 13, . . . are HIGH and the state of the input signal 11 transfers from LOW to HIGH, therefore, the turn-on of the N-channel transistor 31 to which the input signal 11 is applied is faster than the turn-off of the P-channel transistor 21 to which the same input signal 11 is applied. Consequently, the transition from HIGH to LOW of an output signal A of the NAND circuit 4 is faster than that in the case where the W/L ratio of the N-channel transistors 31, 32, 33, . . . is not greater than the W/L ratio of the P-channel transistors 21, 22, 23, . . . By contrast, in the NOR circuit 5 shown in FIG. 3, the W/L ratio of the P-channel transistors 41, 42, 43, . . . is greater than the W/L ratio of the N-channel transistors 51, 52, 53, . . . When, for example, an input signal 101 is HIGH and other input signals 102, 103, . . . are LOW and the state of the input signal 101 transfers from HIGH to LOW, therefore, the transition from LOW to HIGH of an output signal B of the NOR circuit 5 is faster than that in the case where the W/L ratio of the P-channel transistors 41, 42, 43, . . . is not greater than the W/L ratio of the N-channel transistors 51, 52, 53, . . . When the NAND circuit 4 and NOR circuit 5 operate in succession so as to perform the function of a row decoder, therefore, the transition from LOW to HIGH of the output signal B is relatively fast.

On the other hand, when all of the input signals 11, 12, 13, . . . to the NAND circuit 4 are HIGH and the state of one of the input signals transfers from HIGH to LOW, the transition from LOW to HIGH of the output signal A from the NAND circuit 4 is relatively slow. When all of the input signals 101, 102, 103, . . . applied to the NOR circuit 5 are LOW and the state of one of the input signals transfers from LOW to HIGH, the transition from HIGH to LOW of the output signal B from the NOR circuit 5 is relatively slow. When the NAND circuit 4 and NOR circuit 5 operate in succession so as to perform the function of a row decoder, therefore, the transition from HIGH to LOW of the output signal B is relatively slow.

As seen from the above description, in a prior art row decoder, the transition from LOW to HIGH of the output signal is fast (e.g., the output a), while the transition of the output signal from HIGH to LOW is slow (e.g., the output e). As shown in FIG. 5, therefore, a prior art row decoder involves a problem in that the overlap $T_1$ of the transient periods of different output signals is comparatively long, which may lead to the trouble of the double selection of memory cells, resulting in that the storage contents are thus possibly destroyed.

SUMMARY OF THE INVENTION

The row decoder for a semiconductor memory device of this invention, which overcomes the above-discussed and numerous other disadvantages and deficiencies of the prior art, comprises one or more CMOS NAND circuits each having one or more P-channel transistors and one or more N-channel transistors; and one or more CMOS NOR circuits which follow said NAND circuits, said NOR circuits having one or more P-channel transistors and one or more N-channel transistors, the ratio of the channel width to the channel length of said P-channel transistors of said NAND circuits (first W/L ratio) is greater than that of said N-channel transistors of said NAND circuits (second W/L ratio), and the ratio of the channel width to the channel length of said N-channel transistors of said NOR circuits (third W/L ratio) is greater than that of said P-channel transistors of said NOR circuits (fourth W/L ratio).

Thus, the invention described herein makes possible the objectives of (1) providing a row decoder for a semiconductor memory device in which the overlap of the transient periods of different output signals is short; and (2) providing a row decoder for a semiconductor memory device in which double selection of memory cells can be avoided.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
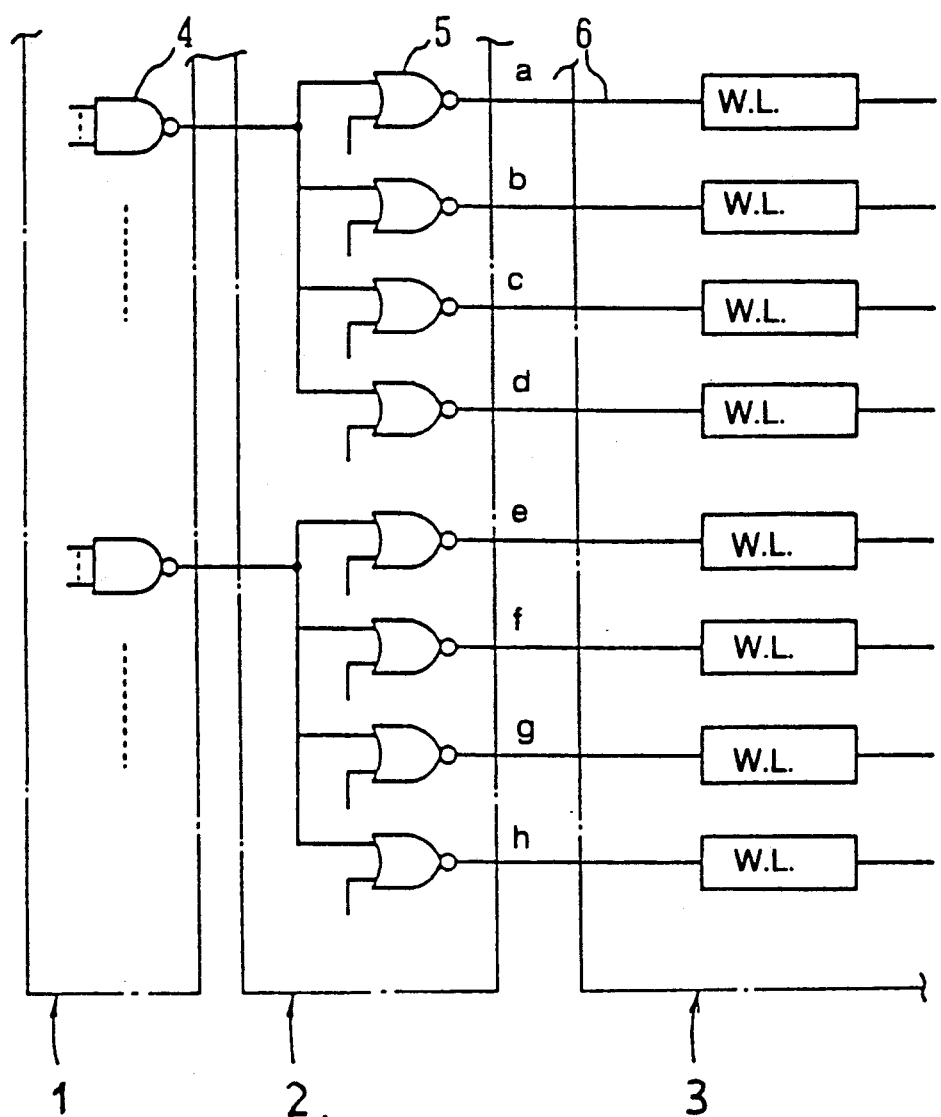
FIG. 1 is a circuit diagram showing a row decoder of a semiconductor memory device.
Figure 2:
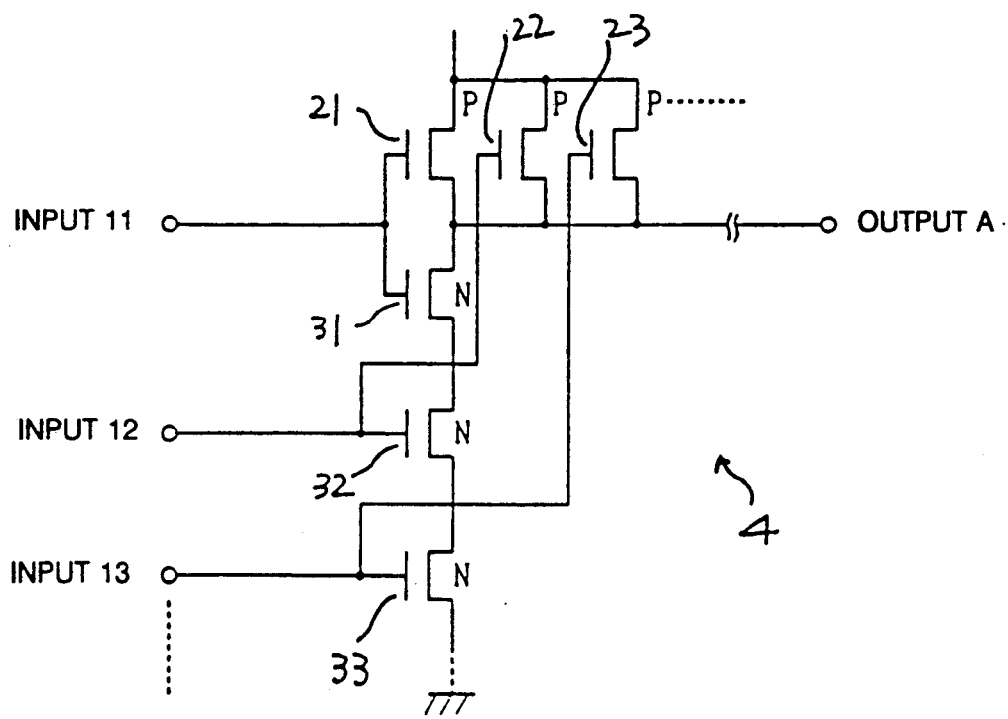
FIG. 2 is a circuit diagram of an NAND circuit used in the decoder of FIG. 1.
Figure 3:
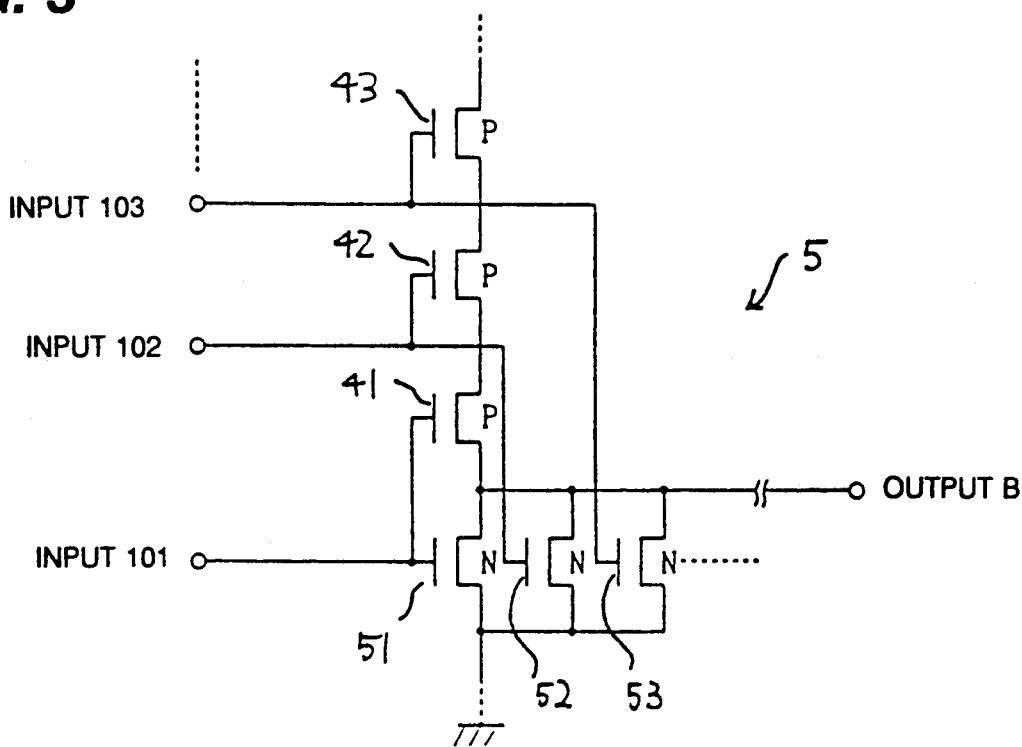
FIG. 3 is a circuit diagram of an NOR circuit used in the decoder of FIG. 1.

A row decoder according to the invention will be described. The embodiment illustrated below has the same circuit configuration as that of the prior art row decoder shown in FIGS. 1 to 3. However, in each CMOS type NAND circuit 4 of the predecoder 1 of this embodiment, the W/L ratio of the P-channel transistors 21, 22, 23, . . . is greater than the W/L ratio of the N-channel transistors 31, 32, 33, . . . Similarly, in each CMOS type NOR circuit 5 of the main decoder 2, the W/L ratio of the N-channel transistors 51, 52, 53, . . . is greater than the W/L ratio of the P-channel transistors 41, 42, 43, . . .

In the embodiment having the above-described structure, when, for example, an input signal 11 is LOW and other input signals 12, 13, . . . are HIGH and the state of the input signal 11 transfers from LOW to HIGH, the turn-off of the P-channel transistor 21 to which the input signal 11 is applied is faster than the turn-on of the N-channel transistor 31 to which the input signal 11 is applied, because the W/L ratio of the P-channel transistors 21, 22, 23, . . . of the NAND circuits 4 of the predecoder 1 is greater than the W/L ratio of the N-channel transistors 31, 32, 33, . . . Accordingly, the transition from HIGH to LOW of the output signal A from the NAND circuit 4 is slower than that in the case where the W/L ratio of the P-channel transistors 21, 22, 23, . . . is not greater than the W/L ratio of the N-channel transistors 31, 32, 33, . . .

The W/L ratio of N-channel transistors 51, 52, 53, . . . in each NOR circuit 5 of the main decoder 2 is greater than the W/L ratio of P-channel transistors 41, 42, 43, . . . in the same circuit. When, for example, the input signal 101 is HIGH and all of the other input signals 102, 103, . . . are LOW and the state the input signal 101 transfers from HIGH to LOW, therefore, the transition from LOW to HIGH of the output signal B from the NOR circuit 5 is slower than that in the case where the W/L ratio of the N-channel transistors 51, 52, 53, . . . is not greater than the W/L ratio of the P-channel transistors 41, 42, 43, . . . Therefore, when the NAND circuit 4 and the NOR circuit 5 operate in succession so as to perform the function of a row decoder, the transition from LOW to HIGH of the output signal B is relatively slow.

On the other hand, when all of the input signals 11, 12, 13, . . . to the NAND circuit 4 are HIGH and the state of one of the input signals transfers from HIGH to LOW, the transition from LOW to HIGH of the output signal A from the NAND circuit 4 is relatively fast. When all of the input signals 101, 102, 103, . . . applied to the NOR circuit 5 are LOW and the state of one of the input signals transfers from LOW to HIGH, the transition from HIGH to LOW of the output signal B from the NOR circuit 5 is relatively fast. When the NAND circuit 4 and the NOR circuit 5 operate in succession so as to perform the function of a row decoder, therefore, the transition from HIGH to LOW of the output signal B is relatively fast.

Figure 4:
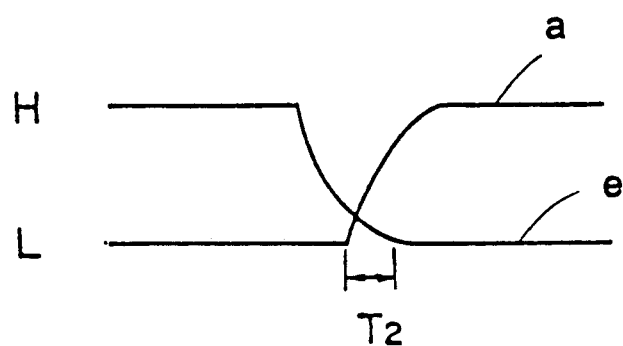
FIG. 4 illustrates an overlap of output signals in a row decoder according to the invention.
Figure 5:
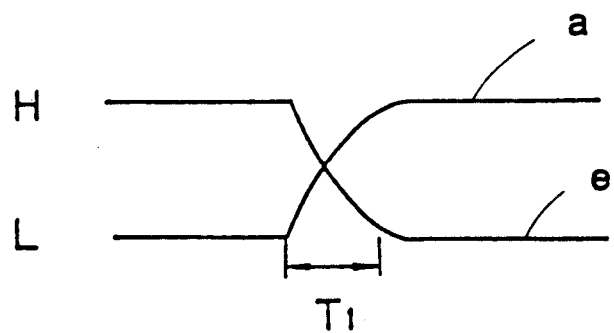
FIG. 5 illustrates an overlap of output signals in a conventional row decoder.

As described above, in the row decoder, the transition from LOW to HIGH of the output signals is slower (e.g., the output a), and the transition from HIGH to LOW thereof is faster (e.g., the output e). As shown in FIG. 4, therefore, the overlap $T_2$ of the transient periods of different output signals is comparatively short. Hence, the possibilities of the double selection of memory cells and of the destruction of the contents of memory cells can be effectively eliminated.

According to the invention, the values of the W/L ratios of the P-channel and N-channel transistors may be selected from a wide range according to the design of a semiconductor memory device, provided that the values of the W/L ratios satisfy the above-mentioned conditions.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a row decoder for a semiconductor memory device, comprising:
   one or more CMOS NAND circuits each having one or more P-channel transistors, one or more N-channel transistors, a plurality of inputs and an output; and
   one or more CMOS NOR circuit sets which are respectively connected to the outputs of said one or more CMOS NAND circuits, each of said CMOS NOR circuit sets including one or more CMOS NOR circuits, each of said CMOS NOR circuits having one or more P-channel transistors one or more N-channel transistors and an output,
   the ratio of the channel width to the channel length of said P-channel transistors of said NAND circuits is greater than that of said N-channel transistors of said NAND circuits, and
   the ratio of the channel width to the channel length of said N-channel transistors of said NOR circuits is greater than that of said P-channel transistors of said NOR circuits.

* * * * *